United States Patent
Chen

(10) Patent No.: US 7,968,793 B2
(45) Date of Patent: Jun. 28, 2011

(54) SOLAR CELL

(75) Inventor: Ga-Lane Chen, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 471 days.

(21) Appl. No.: 12/106,537

(22) Filed: Apr. 21, 2008

(65) Prior Publication Data

US 2009/0056809 A1    Mar. 5, 2009

(30) Foreign Application Priority Data

Aug. 28, 2007 (CN) .......................... 2007 1 0201496

(51) Int. Cl.
*H01L 31/00* (2006.01)
(52) U.S. Cl. ....................................... 136/262; 136/252
(58) Field of Classification Search .................. 136/252, 136/262
See application file for complete search history.

(56) References Cited

U.S. PATENT DOCUMENTS

| | | |
|---|---|---|
| 7,179,987 B2 | 2/2007 | Fath et al. |
| 2005/0061363 A1* | 3/2005 | Ginley et al. ................. 136/252 |
| 2005/0183769 A1* | 8/2005 | Nakagawa et al. ........... 136/263 |
| 2006/0207647 A1* | 9/2006 | Tsakalakos et al. .......... 136/256 |
| 2006/0213547 A1* | 9/2006 | Tanaka et al. ................. 136/244 |
| 2008/0047602 A1* | 2/2008 | Krasnov ........................ 136/256 |
| 2008/0066802 A1* | 3/2008 | Reddy ............................ 136/258 |

FOREIGN PATENT DOCUMENTS

CN    1760405 A    4/2006

* cited by examiner

*Primary Examiner* — Jeffrey T Barton
*Assistant Examiner* — Allison Bourke
(74) *Attorney, Agent, or Firm* — Andrew C. Cheng

(57) ABSTRACT

A solar cell includes a back metal-contact layer, a P-type semiconductor layer, a P-N junction layer, an N-type semiconductor layer and a transparent electrically conductive layer. The P-type semiconductor layer is formed on the back metal-contact layer. The P-type semiconductor layer is comprised of nano particles of a P-type semi-conductive compound. The P-N junction layer is formed on the P-type semiconductor layer. The N-type semiconductor layer is formed on the P-N junction layer. The N-type semiconductor layer is comprised of nano particles of an N-type semi-conductive compound. The transparent electrically conductive layer is formed on the N-type semiconductor layer and functions as a front contact layer.

15 Claims, 1 Drawing Sheet

SOLAR CELL

BACKGROUND

1. Technical Field

The present invention relates to solar cells, and particularly, to a solar cell made of semi-conductive compounds.

2. Description of Related Art

Currently, various solar cells have been designed to receive and convert sunlight into electrical energy. Such solar cells have been applied on roofs of buildings and cars, or applied on portable electronic devices.

In a typical solar cell, a P-type semiconductor layer and an N-type semiconductor layer are two key components. When sunlight projects on surfaces of the P-type semiconductor layer or the N-type semiconductor layer, a part of the sunlight is unavoidably reflected by the surfaces, and the other is absorbed. Photons in the absorbed sunlight collide with electrons in the P-type semiconductor layer or the N-type semiconductor layer, thereby, electron-hole pairs are generated, and thus an electric field is formed between the P-type semiconductor layer and the N-type semiconductor layer, i.e., a photon-electron conversion is realized.

The P-type semiconductor layer and N-type semiconductor layer of the solar cell can be made of silicon based materials, or semi-conductive compounds. However, cost of the silicon based materials is hard to be reduced. In addition, lattice defects, such as dislocations and stacking faults, are prone to occur in the semiconductor layers during formation when the semi-conductive compounds are used, and thus the efficiency of the photon-electron conversion is difficult to be improved.

What is needed, therefore, is a solar cell with fewer lattice defects and higher photon-electron conversion efficiency using the semi-conductive compounds.

SUMMARY

An exemplary solar cell includes a back metal-contact layer, a P-type semiconductor layer, a P-N junction layer, an N-type semiconductor layer and a transparent electrically conductive layer. The P-type semiconductor layer is formed on the back metal-contact layer. The P-type semiconductor layer is comprised of nano particles of a P-type semi-conductive compound. The P-N junction layer is formed on the P-type semiconductor layer. The N-type semiconductor layer is formed on the P-N junction layer. The N-type semiconductor layer is comprised of nano particles of an N-type semi-conductive compound. The transparent electrically conductive layer is formed on the N-type semiconductor layer and functions as a front contact layer.

Other advantages and novel features of the present invention will become more apparent from the following detailed description of preferred embodiment when taken in conjunction with the accompanying drawing.

BRIEF DESCRIPTION OF THE DRAWINGS

Many aspects of the solar cell can be better understood with reference to the following drawing. The components in the drawing are not necessarily drawn to scale, the emphasis instead being placed upon clearly illustrating the principles of the present solar cell.

The drawing is a schematic view of a solar cell in accordance with an exemplary embodiment of the present invention.

DETAILED DESCRIPTION OF THE EMBODIMENTS

Figure 1:
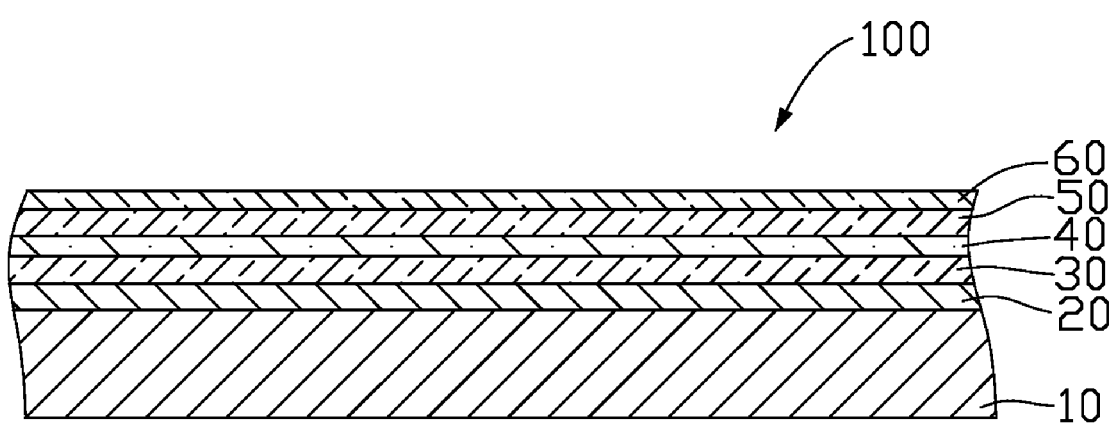

Embodiments of the present solar cell will now be described in detail below and with reference to the drawing.

Referring to the drawing, an exemplary solar cell 100 is shown. The solar cell 100 includes a substrate 10, a back metal-contact layer 20, a P-type semiconductor layer 30, a P-N junction layer 40, an N-type semiconductor layer 50 and a transparent electrically conductive layer 60.

The substrate 10 can be rigid or flexible according to need. A material of the substrate 10 can be selected from glass, ceramic, plastic and stainless steel.

The back metal-contact layer 20 is comprised of a material selected from silver, copper, molybdenum, aluminum, copper aluminum alloy, silver copper alloy, and copper molybdenum alloy. The back metal-contact layer 20 is formed on the substrate 10 by DC magnetron sputtering.

The P-type semiconductor layer 30 is comprised of nano particles of a P-type semi-conductive compound. The P-type semi-conductive compound can be selected from a group consisting of nano aluminum gallium arsenide (AlGaAs), nano aluminum gallium nitride doped with hydrogen (AlGaN:H), and nano aluminum gallium nitride doped with magnesium (AlGaN:Mg). The P-type semiconductor layer 30 is deposited on the back metal-contact layer 20 by plasma-enhanced chemical vapor deposition (PECVD) or metal-organic chemical vapor deposition (MOCVD). A thickness of the P-type semiconductor layer 30 is in the range from 1 μm to 10 μm. In order to lower roughness Ra, a size of each particle in the P-type semi-conductive compound is beneficially in the range from 10 nm to 100 nm. Due to the nano size of the P-type semi-conductive compound, it is much easier for the P-type semiconductor layer 30 to have a same lattice distribution as the back metal-contact layer 20, thereby, lattice defects, such as dislocations and stacking faults can be reduced. The P-type semiconductor layer 30 can also have a smooth surface with minimum surface roughness.

The P-N junction layer 40 is comprised of copper indium gallium diselenide ($CuIn_{1-x}GaSe_2$). The P-N junction layer 40 is formed on the P-type semiconductor layer 30, and configured for joining the P-type semiconductor layer 30 and the N-type semiconductor layer 50. Due to the smooth surface of the P-type semiconductor layer 30, contact between the P-N junction layer 40 and the P-type semiconductor layer 30 is enhanced, and thus reducing barrier and friction for the electrons or holes movements therebetween.

The N-type semiconductor layer 50 is comprised of nano particles of an N-type semi-conductive compound. The N-type semi-conductive compound can be selected from a group consisting of nano gallium nitride, nano gallium nitride doped with silicon, and nano indium gallium phosphide. The N-type semiconductor layer 50 is deposited on the P-N junction layer 40 by plasma-enhanced chemical vapor deposition (PECVD) or metal-organic chemical vapor deposition (MOCVD). A thickness of the N-type semiconductor layer 50 is in the range from 0.5 μm to 10 μm. In order to lower roughness Ra, a size of each particle in the N-type semi-conductive compound is beneficially in the range from 10 nm to 100 nm. Similar to the P-type semiconductor layer 30, it is much easier for the N-type semiconductor layer 50 to have a same lattice distribution as the P-N junction layer 40, thereby, lattice defects, such as dislocations and stacking faults can be reduced.

The P-type semiconductor layer 30, the P-N junction layer 40 and the N-type semiconductor layer 50 constitute a semiconductor unit for photon-electron conversion. Lattice defects are reduced in the semiconductor unit, as a result, lattice vibration in the semiconductor unit is decreased. In this way, it is much easier for movements of the photons, electrons or holes in the semiconductor unit, and high photon-electron conversion efficiency can be obtained.

The transparent electrically conductive layer 60 is formed on the N-type semiconductor layer 50. The transparent electrically conductive layer 60 functions as a front contact layer. The transparent electrically conductive layer 60 can be a transparent electrically conductive oxide film, for example, indium tin oxide (ITO) or zinc oxide, and a thickness of the transparent electrically conductive layer 60 may be in the range between 300 nm to 900 nm. Alternatively, the transparent electrically conductive layer 60 can be a carbon nanotube film, and a thickness of the transparent electrically conductive layer 60 may be in the range between 30 nm to 300 nm. The carbon nanotube film is comprised of a number of carbon nanotubes, and the carbon nanotubes are preferably oriented in parallel with the N-type semiconductor layer 50.

In use, the solar cell 100 can be applied on, for example, a roof of a building for the photon-electron conversion.

It is understood that the above-described embodiments are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A solar cell, comprising:
   a back metal-contact layer;
   a P-type semiconductor layer formed on the back metal-contact layer, the P-type semiconductor layer being comprised of nano particles of a P-type semi-conductive compound, and the P-type semi-conductive compound being selected from a group consisting of aluminum gallium arsenide, aluminum gallium nitride doped with hydrogen, and aluminum gallium nitride doped with magnesium;
   a P-N junction layer formed on the P-type semiconductor layer;
   an N-type semiconductor layer formed on the P-N junction layer, the N-type semiconductor layer being comprised of nano particles of an N-type semi-conductive compound; and
   a transparent electrically conductive layer formed on the N-type semiconductor layer for functioning as a front contact layer.

2. The solar cell as described in claim 1, wherein the back metal-contact layer is comprised of a material selected from the group consisting of silver, copper, molybdenum, aluminum, copper aluminum alloy, silver copper alloy, and copper molybdenum alloy.

3. The solar cell as described in claim 1, wherein the N-type semi-conductive compound is selected from a group consisting of gallium nitride, gallium nitride doped with silicon, and indium gallium phosphide.

4. The solar cell as described in claim 1, wherein the P-N junction is comprised of copper indium gallium diselenide.

5. The solar cell as described in claim 1, wherein the transparent electrically conductive layer is transparent electrically conductive oxide film.

6. The solar cell as described in claim 5, wherein a thickness of the transparent electrically conductive layer is in the range between 300 nm to 900 nm.

7. The solar cell as described in claim 1, wherein the transparent electrically conductive layer is carbon nanotube film.

8. The solar cell as described in claim 7, wherein a thickness of the transparent electrically conductive layer is in the range between 30 nm to 300 nm.

9. The solar cell as described in claim 1, wherein a size of each particle in the P-type semi-conductive compound and N-type semi-conductive compound is in a range from 10 nm to 100 nm.

10. The solar cell as described in claim 7, wherein carbon nanotubes of the carbon nanotube film are oriented parallel to the N-type semiconductor layer.

11. A solar cell, comprising:
    a back metal-contact layer;
    a P-type semiconductor layer formed on the back metal-contact layer, the P-type semiconductor layer being comprised of nano particles of a P-type semi-conductive compound;
    a P-N junction layer formed on the P-type semiconductor layer;
    an N-type semiconductor layer formed on the P-N junction layer, the N-type semiconductor layer being comprised of nano particles of an N-type semi-conductive compound, and the N-type semi-conductive compound being selected from a group consisting of gallium nitride, gallium nitride doped with silicon, and indium gallium phosphide; and
    a transparent electrically conductive layer formed on the N-type semiconductor layer for functioning as a front contact layer.

12. The solar cell as described in claim 11, wherein the P-N junction is comprised of copper indium gallium diselenide.

13. The solar cell as described in claim 11, wherein the transparent electrically conductive layer is carbon nanotube film.

14. The solar cell as described in claim 13, wherein carbon nanotubes of the carbon nanotube film are oriented parallel to the N-type semiconductor layer.

15. The solar cell as described in claim 11, wherein the transparent electrically conductive layer is transparent electrically conductive oxide film.

* * * * *